United States Patent [19]

Wilson et al.

[11] 3,895,430

[45] July 22, 1975

[54] METHOD FOR REDUCING BLOOMING IN SEMICONDUCTOR ARRAY TARGETS

[75] Inventors: Ronald H. Wilson, Schenectady; Martin D. Gibbons, Camillus; Samuel M. Blumenfeld, Schenectady, all of N.Y.

[73] Assignee: General Electric Company, Schenectady, N.Y.

[22] Filed: Sept. 20, 1973

[21] Appl. No.: 398,928

[62] Division of Ser. No. 235,592, Mar. 17, 1972.

[52] U.S. Cl. ................ 29/584; 250/492 A; 357/91; 148/1.5; 29/578

[51] Int. Cl. .............................................. B01j 17/00

[58] Field of Search .................. 29/578, 576 B, 584; 317/235 AY; 148/1.5; 250/492 A

[56] References Cited

UNITED STATES PATENTS

| | | | |
|---|---|---|---|
| 3,558,366 | 1/1971 | Lepselter | 29/578 |
| 3,638,300 | 2/1972 | Foxhall | 148/1.5 |
| 3,676,727 | 7/1972 | Dalton | 317/235 AY |
| 3,718,502 | 2/1973 | Gibbons | 317/235 AY |
| 3,773,566 | 11/1973 | Tsuchimoto | 148/1.5 |

*Primary Examiner*—W. Tupman

*Attorney, Agent, or Firm*—Daniel R. Levinson; Joseph T. Cohen; Jerome C. Squillaro

[57] ABSTRACT

Highlight blooming is reduced in semiconductor diode array camera targets by forming electron-hole recombination sites intermediate the diodes. These sites collect excess holes created by intense light images incident on the target and reduce blooming. The recombination sites are formed by selectively irradiating regions of the semiconductor substrate between the diodes and beyond the limits of the depletion region surrounding the reverse-biased diodes. Useful forms of radiation which produce these recombination sites include electron beam and ultraviolet rays.

9 Claims, 1 Drawing Figure

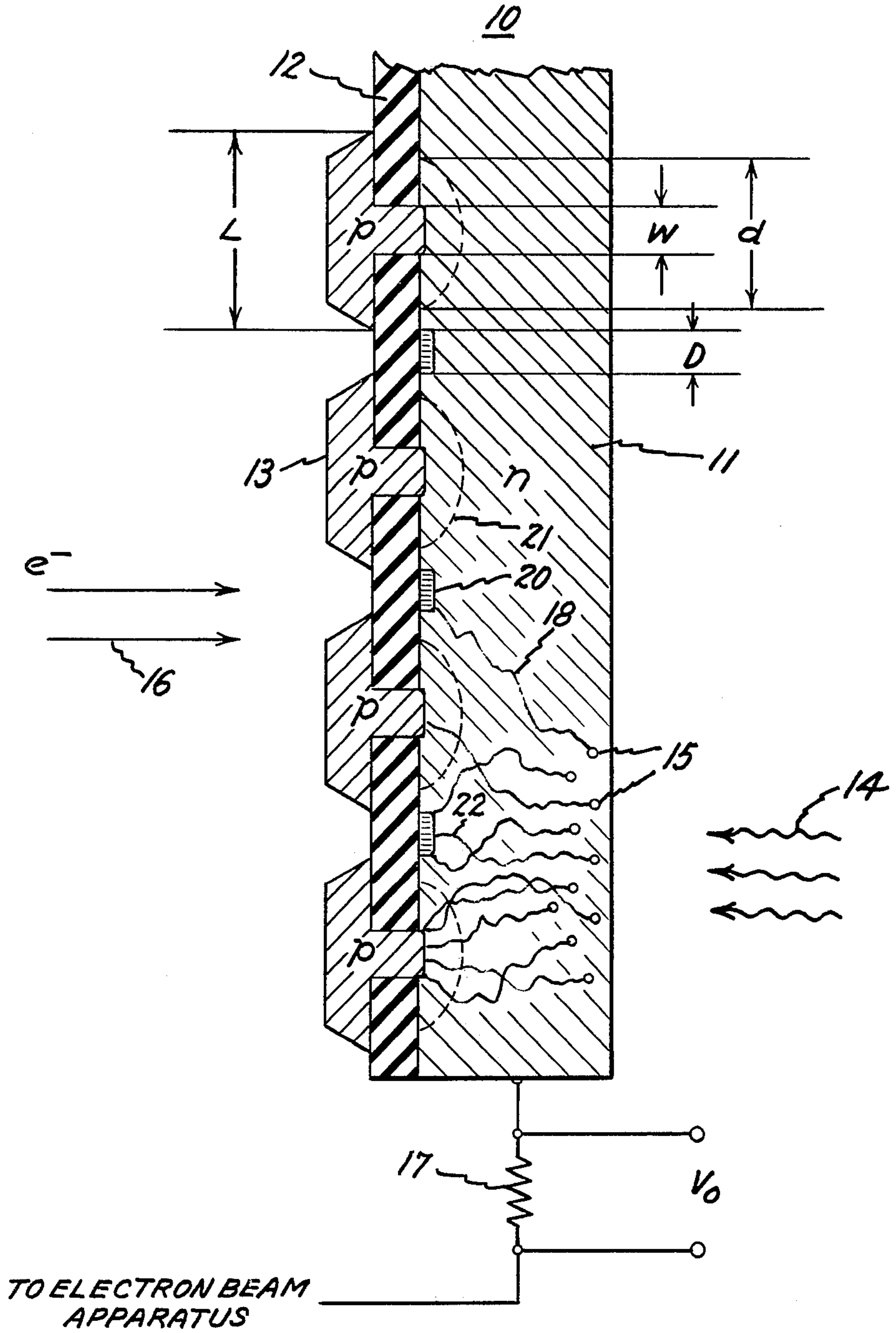
10
12
L
p
w
d
D
11
13
n
21
e⁻
20
18
16
15
14
22
17
V₀
TO ELECTRON BEAM
APPARATUS

METHOD FOR REDUCING BLOOMING IN SEMICONDUCTOR ARRAY TARGETS

This is a division of application Ser. No. 235,592, filed Mar. 17, 1972.

The invention relates to diode array camera tube targets, and in particular, to a method of treating these targets to reduce undesirable blooming effects.

As is well known, diode array camera tube targets generally comprise a wafer of semiconductive material, generally n-type silicon, having an array of diodes formed on one side thereof. For example, the diodes can be formed by covering one side of the target with an insulating layer, etching a pattern of holes in the insulating layer and epitaxially growing boron doped p-type silicon projections through the holes and over the oxide to form a plurality of p-type conductivity regions.

In operation, the diode array is scanned by an electron beam, charging the p-type conductivity regions. A light image or electron image incident upon the opposite side of the target generates electron-hole pairs. The holes drift to the diode side of the target where they discharge selected diodes in the same pattern as the light image. During a subsequent scan, the current needed to restore the charged condition of the diodes is monitored and provides a video output signal.

When the intensity of the incident light image produces more holes in the silicon wafer than can be collected the excess holes diffuse to other diodes outside the periphery of the generation area and are collected there. The effect of the excess holes is to produce a video signal such that when displayed, the image appears larger than it should and the detail in the lower intensity background is obscured. This undesirable effect is called highlight blooming.

An excess number of holes are generated in a semiconductor target, for example, when the target is subjected to a bright beam of light. The number of holes generated may in this case be as much as $10^5$ times the number normally required to discharge all the diodes in the vicinity of the actual beam diameter. The excess holes, which cannot be collected by the diodes in the vicinity, diffuse laterally and are collected by the diodes in the area farther from the beam or image spot where they are read out as part of the video signal. Thus the lateral diffusion distorts the image.

Highlight blooming can be optically reduced to some extent by increasing (numerically) the f-stop of the camera optics. This, however, dims the entire image as well as the highlights.

The blooming may also be controlled to a limited extent electrically, i.e., within the physics of the wafer. One method for doing this is to decrease the lifetime of the holes. This can be done by shortening the bulk recombination time, i.e., the lifetime of a hole within the semiconductive wafer. The bulk recombination time can be shortened by the addition of a recombination centers such as copper or gold, for example. However, the result is similar to that of the optical approach. Further, target parameters are adversely affected; for example, the dark current increases.

In view of the foregoing, it is therefore an object of the present invention to provide a novel method for minimizing highlight blooming in a semiconductor diode target.

Another object of the present invention is to reduce highlight blooming in diode array targets with minimal effect on other target characteristics.

A further object of the present invention is to minimize highlight blooming in diode array targets by providing surface recombination centers outside the diode depletion region for collecting laterally diffusing holes.

Another object of the present invention is to provide an easily performed method of minimizing highlight blooming in diode array targets by utilizing diode caps as a mask during processing.

The foregoing objects are achieved in accordance with one embodiment of the present invention wherein a semiconductor diode array is irradiated with selected radiation to create surface recombination centers at the semiconductor-insulator interface areas between the diodes. Excess holes produced in response to a very bright image are collected or neutralized by electrons at these recombination centers and thus are prevented from drifting laterally to produce blooming.

A more complete understanding of the present invention can be obtained by considering the following detailed description in conjunction with the accompanying drawing, in which:

The FIGURE illustrates schematically a diode array target formed in accordance with the present invention.

As illustrated in the FIGURE, target 10 comprises a semiconductor substrate 11, which may for example comprise n-type conductivity silicon having an insulating layer 12 such as silicon dioxide formed thereon. Insulating layer 12 contains a plurality of apertures through which p-type conductivity material 13 is epitaxially grown. The p-type conductivity material 13 forms *p–n* junction diodes at the interface with substrate 11. P-type conductivity material 13 also extends laterally over a substantial portion of the insulating layer to prevent charging of the insulating layer 12 by electron beam 16. A more detailed description of a method of making semiconductor targets is described by William E. Engeler, in application Ser. No. 60,767, filed Aug. 3, 1970 and assigned to the same assignee as the present invention; the entire disclosure of which is incorporated herein by reference.

Target 10 operates in a manner similar to semiconductor diode array targets generally in which an image is focused on the side of target opposite the diode array. Radiation incident on the target, such as photons or electrons 14 induce holes 15 within substrate 11. These holes drift toward the diode array side of the target and discharge the previously charged diodes in proportion to the intensity of the incident radiation. During a subsequent scan by electron beam 16, the amount of current necessary to recharge the diodes is monitored as the voltage drop across resistor 17. The voltage drop across resistor 17 provides the video output signal from the target.

When the incident photons or electrons 14 produce more holes 15 than can recombine at the diode opposite the generation region of the hole, some of the excess holes follow a path such as path 18 and drift laterally away from the generation area. This lateral drift causes the undesirable blooming effect described previously.

In accordance with the present invention, recombination sites 20 are provided in the diode array surface of substrate 11 so as to collect or trap laterally diffusing holes, thereby preventing the blooming of very bright images. It has been discovered that by exposing the semiconductor target to certain selected radiation, recombination sites can be induced at the interface between substrate 11 and insulator 12.

As illustrated in the FIGURE, there are some dimensional restrictions to be satisfied in providing the recombination centers in accordance with the present invention. More specifically, the FIGURE illustrates insulating layer 12 as having a plurality of apertures of width *w* through which the p-type conductivity regions are formed. However, during the operation of the diode array, depletion region 21 having a maximum width *d* is formed that extends over a greater radius than that of the aperture in insulating layer 12. Thus, the effective area of a diode is greater than its physical area at the surface of substrate 11. For proper operation of the target, the width D of the recombination sites must be such that depletion regions 21 and recombination sites 20 do not touch.

This requirement can be fulfilled, for example, by exposing the diode side of the target to selected radiation. P-type semiconductor material 13 acts as a mask to the incident radiation and hence recombination sites 20 are formed only in those regions intermediate the p-type semiconductor material subjected to the radiation. Instead of p-type semiconductor material as a radiation mask, other non-insulating shields or caps may be utilized in fulfilling this requirement. For example, registered metal caps applied over planar p-n junctions may also be utilized.

When laterally extending, non-insulating caps are utilized, it is desirable that the width of the cap L exceed the depletion width *d* so that, when the diode array is irradiated, the caps act as a mask forming the recombination sites in a self-registered fashion in the region between the diodes of the diode array and out of contact with the depletion region associated with each diode.

A typical semiconductor target utilizing the novel features of the present invention, for example, may comprise a substrate of 10 ohm-centimeter n-type silicon having a 9000A thick silicon dioxide insulating layer with a plurality of 5 microns wide apertures on 25 micron centers. In operation, the diameter of the depletion region along the surface is typically 15 microns and the diameter of the projection is typically 21 microns. Thus the region in between the projection available for recombination sites has 4 microns as its minimum dimension, and the projections extend 3 microns beyond the depletion region around the perimeter of each diode in the diode array. The center to center spacing minus the depletion width at the surface yields the maximum diameter the recombination centers can approach, in this case 10 microns. Thus, for the above example, there is a 3 micron safety factor on each side of recombination center 20.

The depletion width obtained varies with the resistivity of the semiconductor material. Thus the size of the depletion region can be modified by varying the resistivity of the semiconductor substrate. However, reducing the resistivity of the semiconductor substrate to provide narrower depletion regions may adversely affect the operational characteristics of the target in some circumstances.

In accordance with the present invention, as part of the target processing, a target as described above is irradiated with selected radiation to produce recombination sites at the interface between substrate 11 and insulator 12. While recombination sites 20 are illustrated as extending into substrate 11, it should be understood that this is for the sake of illustration only. The recombination sites exist at the interface between substrate 11 and insulator 12.

Recombination sites 20 are formed in accordance with one embodiment of the invention by directing a 10 KeV electron beam, for example, at the diode side of target for a sufficient time to cause $10^{10}$ to $10^{15}$ electrons per square centimeter to fall on the target. This radiation is sufficient to form the desired recombination sites for preventing excess holes from causing highlights blooming. It should be noted that recombination sites 20 are formed by only one exposure to the electron beam and that the electrons utilized in generating the recombination sites are not utilized subsequently in neutralizing or collecting laterally diffusing holes. In other words, the electrons which are used to form recombination sites 20 do take part in the subsequent operation of the target.

Since the electrons from the irradiation of the target are not utilized in the neutralization of holes during the subsequent operation of the target, the target need only be so irradiated once. It should be further pointed out that the irradiating electron beam utilized in making the target is not the same as the electron beam utilized for the operation of the target in a camera tube. The energy of the electrons during the formation of the recombination sites is on the order of 10 kilovolts, i.e. from 5 to 25 kilovolts. However, during the operation of the target, the target is biased generally at about 10 volts relative to the source of electrons and the actual landing energy of the electrons is usually on the order of 3 volts. Thus the landing energy of the electrons utilized in the operation of the target is several orders of magnitude smaller than the energy of the electrons utilized in the processing of the target.

The high landing energy is determined in part by the thickness of insulating layer 12. Thus, the above range is suitable for a 9000A thick oxide layer and varies roughly in proportion to the thickness of the insulating layer. In general, the radiation must be sufficient to penetrate the insulating layer and have enough energy remaining to cause the formation of recombination sites. In the case of an electron beam, a 4500A thick oxide layer would reduce the lower boundary of the range to about 2.5 kilovolts. The upper boundary need not be reduced as much since it is determined by the degree of penetration of the overlying cap, rather than oxide thickness alone. In other words, too high an energy reduces the effectiveness of the caps to act as a self-registered mask during the process.

A second example of suitable radiation in accordance with the present invention is ultraviolet radiation. A suitable target with the desired recombination sites is constructed by irradiating the diode side of a semiconductor target with a 100 watt ultraviolet mercury lamp at a distance of about 5 centimeters, for example. The target is exposed to this radiation for approximately 150 hours, during which time the total ultraviolet radiation at the target surface is approximately $5\times10^5$ joules per square centimeter. This corresponds to a dosage of approximately $10^{23}$ photons, having an average wavelength of 3000A, per square centimeter of target surface. The number of recombination centers created by this process is believed dependent on the total photon dosage. Thus, maintaining the photon dosage between approximately $10^{20}$ and $10^{26}$ photons per square centimeter provides adequate reduction in blooming. The wavelength of the incident photons is preferably in the ultraviolet region of the spectrum, i.e., between approximately 4 and 4000A. Exposure with the above-noted lamp can vary from 1–300 hours.

Semiconductor targets made in accordance with the present invention exhibit substantial reductions in blooming effects. For example, a light spot having a diameter of 1% of the scanned dimension of the target blooms to a diameter of 7% of the scanned dimension in a non-irradiated target when the intensity of the spot is increased 100-fold, whereas a similar spot bloomed to only 2% of the scanned dimension in a target irradiated with $10^{13}$ electrons per square centimeter at an energy of 10 kilovolts. Targets made in accordance with the present invention may reduce slightly the sensitivity of the target to incident images. For example, if the holes generated in response to an image drift along path 22 to a recombination site and not to either of the diodes that are generally opposite the generation region of the holes, there may be a reduction in sensitivity. The reduction in sensitivity can be eliminated, for example, by suitably tailoring the resistivity profile of the n-type wafer near the silicon surface so as to allow the depletion region of the diode to be wider 2–3 microns below the surface than it is at the surface. This can be accomplished by ion implantation using the non-insulating caps as a mask.

Having thus described the invention it will be apparent to those of ordinary skill in the art that various modifications can be made within the spirit and scope of the present invention. As noted above, a variety of targets can be treated in accordance with the present invention provided that the depletion region and the recombination sites are kept separated. This can be done for example by varying the impurity concentration or conductivity type in the region between the diodes in the array to provide isolation for the recombination sites.

What we claim as new and desire to secure by Letters Patent of the United States is:

1. A method for reducing highlight blooming in a diode array camera the target having a plurality of diodes formed on one side of a semiconductor wafer and an insulating layer overlying the semiconductor between said diodes to form a semiconductor-insulator interface comprising the step of:

selectively irradiating the region between said diodes with electrons having an energy of approximately 10 kilovolts providing a dosage of approximately $10^{10}$ to $10^{15}$ electrons per square centimeter to establish recombination sites at the semiconductor-insulator interface between said diodes.

2. A method for reducing highlight blooming in a diode array camera tube target having a plurality of diodes formed on one side of a semiconductor wafer and an insulating layer overlying the semiconductor between said diodes to form a semiconductor-insulator interface comprising the step of:

selectively irradiating said array with $10^{20}$ to $10^{26}$ photons per square centimeter of ultraviolet radiation having a wavelength less than approximately 3500A to establish recombination sites at the semiconductor-insulator interface between said diodes.

3. The method of making electron beam scanned diode array targets comprising the steps of:

depositing an insulating layer on one face of a semiconductor wafer;

etching an array of apertures in said insulating layer;

forming an array of diodes through said apertures, said diodes having a center-to-center spacing in excess of the widths of depletion regions formed by adjacent diodes during operation;

providing each diode with a non-insulating cap extending laterally over a portion of said insulating layer around each diode a distance greater than the depletion width of the respective diodes;

irradiating said target utilizing the non-insulating caps as a mask, to establish recombination sites at the semiconductor-insulator interface, said recombination sites having widths less than the remainder of said center-to-center spacing minus the width of said depletion region.

4. The method as set forth in claim 3 wherein said irradiation step comprises:

selectively irradiating with an electron beam.

5. The method as set forth in claim 3 wherein said irradiating step comprises:

irradiating said target with ultraviolet light.

6. The method as set forth in claim 3 wherein said irradiating step comprises:

irradiating said target with an electron beam having an incident dose in excess of $10^{10}$ electrons per square centimeter.

7. The method as set forth in claim 3 wherein said irradiating step comprises:

irradiating said target with a 10 kilovolt electron beam to produce a dose of about $10^{10}$ to $10^{15}$ electrons per square centimeter.

8. The method as set forth in claim 3 wherein said irradiating step comprises:

irradiating said target with from $10^{20}$ to $10^{26}$ photons per square centimeter of ultraviolet radiation.

9. The method as set forth in claim 8 wherein said irradiation step comprises:

irradiating said target with the output of a 100 watt ultraviolet mercury lamp positioned about 5 centimeters from said target for from 1 to 300 hours.

* * * * *